(12) United States Patent
Lee et al.

(10) Patent No.: US 8,568,963 B2
(45) Date of Patent: Oct. 29, 2013

(54) METHOD OF MANUFACTURING MASK FOR DEPOSITING THIN FILM

(75) Inventors: Sang-Shin Lee, Yongin (KR); Jung-Woo Ko, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 225 days.

(21) Appl. No.: 13/015,465

(22) Filed: Jan. 27, 2011

(65) Prior Publication Data
US 2011/0183271 A1    Jul. 28, 2011

(30) Foreign Application Priority Data
Jan. 28, 2010    (KR) .................. 10-2010-0008016

(51) Int. Cl.
*G03C 5/04*    (2006.01)

(52) U.S. Cl.
USPC ........................... 430/323; 430/396; 430/945

(58) Field of Classification Search
USPC ........................................ 430/323, 396, 945
See application file for complete search history.

(56) References Cited

U.S. PATENT DOCUMENTS

| 2002/0111035 A1 | 8/2002 | Atobe et al. |
| 2004/0026382 A1 | 2/2004 | Richerzhagen |
| 2009/0084765 A1* | 4/2009 | Muratsubaki et al. ... 219/121.67 |

FOREIGN PATENT DOCUMENTS

| JP | 9-57937 A | 3/1997 |
| JP | 2000-47364 A | 2/2000 |
| JP | 2002-305079 A | 10/2002 |
| JP | 2005-294206 A | 10/2005 |
| JP | 2008-153258 A | 7/2008 |
| KR | 10-2006-0058458 A | 5/2006 |
| KR | 10-2006-0080476 A | 7/2006 |
| WO | WO 01/75966 A1 | 10/2001 |

OTHER PUBLICATIONS

Korean Office Action dated Apr. 28, 2011 for Korean Patent Application No. KR 10-2010-0008016 which corresponds to captioned U.S. Appl. No. 13/015,465.
Korean Registration Determination Certificate dated Nov. 30, 2011 for Korean Patent Application No. KR 10-2010-0008016 which corresponds to captioned U.S. Appl. No. 13/015,465.

* cited by examiner

*Primary Examiner* — Daborah Chacko Davis
(74) *Attorney, Agent, or Firm* — Knobbe, Martens, Olson, Bear LLP

(57) ABSTRACT

A method of manufacturing a mask for depositing a thin film is disclosed. In one embodiment, the method includes i) providing a raw material substrate for a deposition mask; ii) removing a portion of the raw material substrate to form a pattern, wherein a plurality of openings are defined in the pattern; and iii) irradiating at least a laser beam onto the openings of the pattern at an inclination angle with respect to the raw material substrate such that inclined portions are formed at the side surfaces of each of the openings of the pattern.

10 Claims, 5 Drawing Sheets

METHOD OF MANUFACTURING MASK FOR DEPOSITING THIN FILM

CROSS-REFERENCE TO RELATED PATENT APPLICATION

This application claims the benefit of Korean Patent Application No. 10-2010-0008016, filed on Jan. 28, 2010, in the Korean Intellectual Property Office, the disclosure of which is incorporated herein in its entirety by reference.

BACKGROUND OF THE INVENTION

1. Field of the Invention

The disclosed technology generally relates to a method of manufacturing a mask for depositing a thin film, and more particularly, to a method of manufacturing a mask for depositing a thin film in which a mask pattern includes inclined portions having sharp edges, and thus a shadow effect does not occur.

2. Description of the Related Technology

Flat panel displays, such as liquid crystal displays or electroluminescent displays, are lightweight and thin, and thus research on flat panel displays with high display quality and large screen sizes has been actively conducted. In particular, electroluminescent displays have wide viewing angles, high contrast, and a short response time, and thus they have drawn attention as a next generation display.

In general, electroluminescent displays, which are self-emissive, include an upper electrode, a lower electrode, and an emissive layer disposed between the upper electrode and the lower electrode, and display images by emitting light from the emissive layer in response to voltages applied to the upper and lower electrodes.

SUMMARY OF CERTAIN INVENTIVE ASPECTS

One aspect of the present invention is a method of manufacturing a mask for depositing a thin film, by which a shadow effect is prevented.

Another aspect is a method of manufacturing a mask for depositing a thin film, by which inclined portions are formed at side surfaces of openings of a mask pattern portion.

Another aspect is a method of manufacturing a mask for depositing a thin film, whereby a mask with excellent performance is manufactured at low costs.

Another aspect is a method of manufacturing a mask for depositing a thin film by which inclined portions are formed at side surfaces of openings of a mask pattern.

Another aspect is a method of manufacturing a mask for depositing a thin film, the method comprising: preparing a raw material substrate for a mask; removing a portion of the raw material substrate to form a pattern having a plurality of openings therein; and performing laser processing by irradiating a laser beam onto the raw material substrate at an inclination angle with respect to the raw material substrate to remove portions of the pattern, thereby forming inclined portions at the side surfaces of each of the plurality of openings of the pattern.

In the laser processing, the laser beam may move along the edges of the pattern at the inclination angle. The laser processing may be performed by laser water jet processing in which the laser beam and a water jet are emitted together. The inclination angle may be less than 58°. The inclination angle may be in a range of 10° to 53°.

The laser processing may include: adjusting a direction of a water jet nozzle for ejecting a water jet to form the inclination angle between the water jet nozzle and the raw material substrate; ejecting the water jet via the water jet nozzle; and transmitting the laser beam to the water jet nozzle to irradiate the laser beam onto the raw material substrate.

The laser processing may further include, before the laser beam emitted from a laser beam source reaches the water jet nozzle, transmitting the laser beam through at least one lens.

The pattern formed in the raw material substrate may include a plurality of mask pattern portions respectively corresponding to unit devices arranged on a substrate on which a thin film is to be deposited, a plurality of ribs separating the adjacent mask pattern portions, wherein each of the plurality of mask pattern portions comprises a plurality of openings having the same pattern as that of a thin film constituting the unit device arranged on the substrate on which the thin film is to be deposited and a plurality of shielding portions defining the plurality of openings, wherein each of the plurality of shielding portions defining the plurality of openings has inclined portions at side surfaces thereof.

Each of the plurality of ribs may have an inclined portion at a side surface thereof, which is at a side of one of the plurality of openings. The formation of the pattern may be performed by wet etching. The formation of the pattern may be performed by laser processing in which a laser beam is irradiated onto the raw material substrate to remove portions of the raw material substrate.

Another aspect is a method of manufacturing a mask for depositing a thin film, the method comprising: providing a raw material substrate for a deposition mask; removing a portion of the raw material substrate to form a pattern, wherein a plurality of openings are defined in the pattern; and irradiating at least a laser beam onto the openings of the pattern at an inclination angle with respect to the raw material substrate such that inclined portions are formed at the side surfaces of each of the openings of the pattern.

In the above method, the irradiating comprises moving the laser beam along edges of each of the openings of the pattern at the inclination angle so that at least part of the edges of the openings is removed to form the inclined portions.

In the above method, the irradiating comprises emitting the laser beam and a water jet together. In the above method, the irradiating comprises: adjusting a direction of a water jet nozzle for ejecting a water jet to form the inclination angle between the water jet nozzle and the raw material substrate; ejecting the water jet via the water jet nozzle; and irradiating the laser beam onto the raw material substrate through the water jet nozzle.

The above method further comprises: before the laser beam, emitted from a laser beam source, reaches the water jet nozzle, transmitting the laser beam through at least one lens. In the above method, the inclination angle is less than about 58°. In the above method, the inclination angle is in a range of about 10° to about 53°.

In the above method, the pattern comprises: a plurality of mask pattern portions respectively corresponding to unit devices arranged on a substrate on which a thin film is to be deposited; and a plurality of ribs separating the adjacent mask pattern portions, wherein each of the mask pattern portions comprises i) a plurality of openings having substantially the same pattern as that of a thin film constituting each of the unit devices arranged on the substrate on which the thin film is to be deposited and ii) a plurality of shielding portions defining the openings, wherein each of the shielding portions has inclined portions at side surfaces thereof.

In the above method, each of the ribs has an inclined portion at a side surface thereof, which is at a side of one of the openings. In the above method, the pattern is formed by wet etching. In the above method, the pattern is formed by irradiating a laser beam onto the raw material substrate to remove portions of the raw material substrate.

Another aspect is a method of manufacturing a deposition mask for forming a thin film, the method comprising: providing a mask substrate; forming a photoresist film on the mask substrate; patterning the mask substrate so as to form a plurality of unit mask patterns, wherein a plurality of slits are defined in each of the unit mask patterns, wherein the slits are substantially parallel with each other, and wherein each of the unit mask patterns corresponds to a unit device to be formed by deposition; and irradiating at least a laser beam onto the unit mask patterns along edges of each of the slits at an inclination angle with respect to the mask substrate such that inclined portions are formed at side surfaces of each slit of the unit mask patterns.

In the above method, the patterning is performed by wet etching or laser irradiation. The above method further comprises: providing a laser head comprising a water jet nozzle and a laser nozzle; and ejecting a water jet through the water jet nozzle at the inclination angle with respect to the mask substrate while irradiating the laser beam through the laser nozzle.

In the above method, the center of the laser nozzle is substantially aligned with the center of the water jet nozzle. In the above method, the laser head comprises at least one lens, and wherein the method further comprises: transmitting the laser beam through the at least one lens before the laser beam reaches the water jet nozzle. In the above method, the inclination angle is less than about 58°. In the above method, the inclination angle is in a range of about 10° to about 53°.

Another aspect is a method of manufacturing a deposition mask for forming a thin film, the method comprising: providing a mask substrate; patterning the mask substrate so as to form a plurality of unit mask patterns, wherein a plurality of slits are defined in each of the unit mask patterns, and wherein the slits are substantially parallel with each other; and substantially simultaneously emitting a laser beam and a water jet onto the unit mask patterns along edges of each of the slits at an inclination angle with respect to the mask substrate so that inclined portions are formed at side surfaces of each slit of the unit mask patterns.

The above method further comprises: providing a laser head comprising a water jet nozzle, a laser nozzle and at least one lens, wherein the center of the laser nozzle is substantially aligned with the center of the water jet nozzle; ejecting a water jet through the water jet nozzle at the inclination angle with respect to the mask substrate while irradiating the laser beam through the laser nozzle; and transmitting the laser beam through the at least one lens before the laser beam reaches the water jet nozzle.

DETAILED DESCRIPTION OF CERTAIN INVENTIVE EMBODIMENTS

Electroluminescent displays are classified into inorganic and organic types according to a material of an emissive layer disposed between upper and lower electrodes. An inorganic electroluminescent display includes an emissive layer formed of an inorganic material, and an organic electroluminescent display includes an emissive layer formed of an organic material.

An organic electroluminescent display is generally classified into i) a high molecular weight type including an emissive layer formed of a high molecular weight material and ii) a low molecular weight type including an emissive layer formed of a low molecular weight material.

An organic electroluminescent display includes a micro-patterned thin film, which is formed by photolithography, screen printing, or a deposition method using a micro-metal mask. However, an organic thin film is vulnerable to moisture, and thus it is difficult to form the organic thin film by photolithography. Thus, the deposition method using a micro-metal mask is widely used to form the organic thin film.

However, in a typical method of forming a thin film by using a metal mask, a thin film is not uniformly deposited on a substrate due to a shadow effect, thereby being unable to have a desired thickness. A metal mask pattern is generally formed by etching or using a cutting method using a laser beam. However, in this method, the side surfaces of openings of a mask pattern have large cross-sections, thereby deteriorating a shadow effect.

Hereinafter, embodiments of the present invention will be described in more detail with reference to the accompanying drawings.

Figure 1:
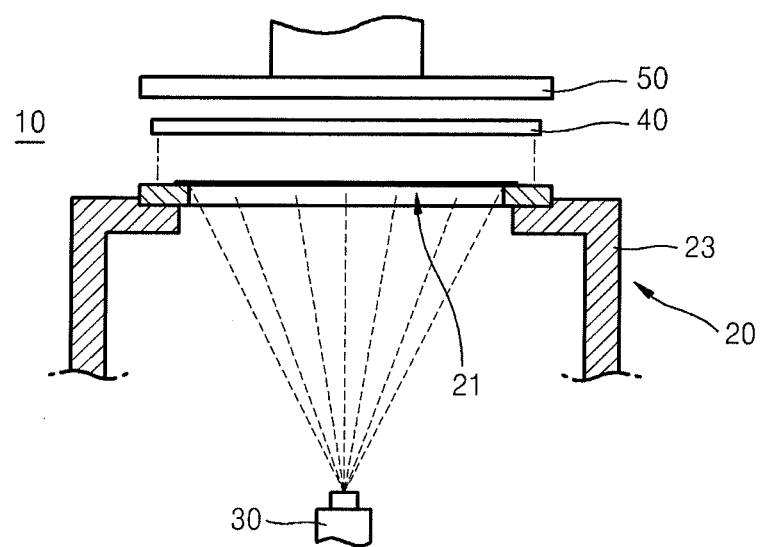
FIG. 1 is a concept view illustrating a method of depositing an organic film of an organic electroluminescent device by using a mask manufactured using a method of manufacturing a mask for depositing a thin film according to an embodiment.

FIG. 1 is a concept view illustrating a method of depositing an organic film of an organic electroluminescent device by using a mask manufactured using a method of manufacturing a mask for depositing a thin film according to an embodiment of the present invention.

Referring to FIG. 1, in the method of depositing an organic film of an organic electroluminescent device, a deposition source 30 for depositing an organic film is positioned in a vacuum chamber 10, and a mask frame assembly 20 is positioned above the deposition source 30. The vacuum chamber 10 is maintained in substantially vacuum state so as not to allow impurities to permeate into the vacuum chamber 10 from the outside thereof, and an internal pressure of the vacuum chamber 10 is adjustable.

The mask frame assembly 20 includes a pattern mask 21 having substantially the same pattern as that of a thin film to be formed on a substrate 40, and a frame 23 for supporting the pattern mask 21. Throughout the specification, the term "substantially the same" includes "the same."

The substrate 40 is disposed above the mask frame assembly 20 corresponding to the pattern mask 21. The substrate 40 is substantially aligned with the pattern mask 21 by a magnet unit 50. After the substrate 40 is aligned with the pattern mask 21, an organic material sprayed from the deposition source 30 is deposited on the substrate 40 via openings of the pattern mask 21 to form the organic film on the substrate 40.

When a thin film is formed on the substrate by using a typical pattern mask, the thin film is not uniformly deposited on the substrate due to a shadow effect caused by the typical pattern mask, and thus a thin film with a desired thickness may not be obtained.

When a mask manufactured using a method of manufacturing a mask for depositing a thin film according to an embodiment of the present invention is used, problems caused by the shadow effect may be addressed. In one embodiment, the openings of the pattern mask 21 each have inclined portions at edges thereof, and thus, when an organic material is deposited on the substrate 40 while the substrate 40 is rotated, a thin film with a uniform thickness is formed on the substrate 40.

Figure 2:
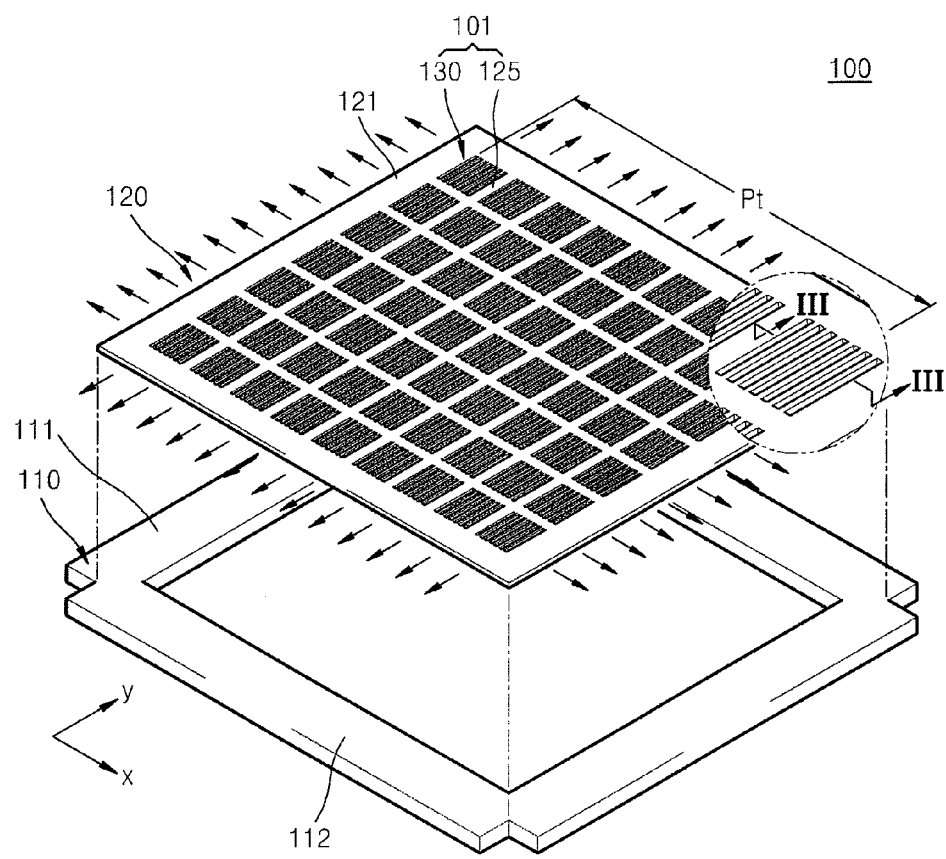
FIG. 2 is an exploded perspective view of a frame assembly of a mask manufactured using a method of manufacturing a mask for depositing a thin film according to an embodiment.

FIG. 2 is an exploded perspective view of a mask frame assembly 100 of a mask 120 manufactured using a method of manufacturing a mask for depositing a thin film according to an embodiment of the present invention.

The mask 120 illustrated in FIG. 2 is a mask used for depositing a thin film of a flat panel display device. The mask frame assembly 100 is used in a method of depositing a thin film, and includes the mask 120 and a frame 110 for supporting the mask 120.

The frame 110 includes vertical supporting parts 111 and horizontal supporting parts 112, wherein the vertical supporting parts 111 and the horizontal supporting parts 112 surround and support edges of the mask 120. A tensile force is applied to the mask 120 by the respective vertical and horizontal supporting parts 111 and 112, and thus the mask 120 is fixed on the frame 110.

In one embodiment, the mask 120 is manufactured by processing a substrate 121 in the form of a thin metal foil, and includes a plurality of mask pattern portions (or unit mask patterns) 130 corresponding to a plurality of unit devices arranged on a raw material plate (not shown), which is a substrate to be deposited. The term "unit device" used herein refers to one display device manufactured by cutting the raw material plate along a scribe line.

The mask 120 has a pattern 101 formed thereon, and the pattern 101 includes a plurality of mask pattern portions 130 and a plurality of ribs 125 that separate the mask pattern portions 130 from each other in x- and y-directions.

Figure 3:
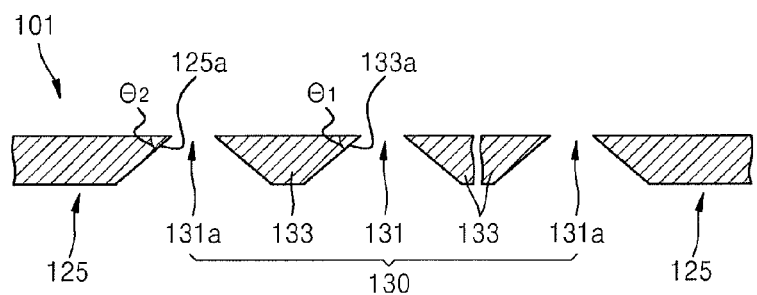
FIG. 3 is a side cross-sectional view taken along a line III-III in the mask for depositing a thin film of FIG. 2, according to an embodiment.

FIG. 3 is a side cross-sectional view taken along a line in the mask 120 for depositing a thin film of FIG. 2, according to an embodiment of the present invention.

Referring to FIG. 3, the mask pattern portion 130 includes a plurality of openings (or a plurality of slits) 131 and 131*a* having substantially the same pattern as that of a thin film to be formed on a substrate, and shielding portions 133. The shielding portions 133 are disposed between the openings 131 and 131*a* to define the openings 131. The openings 131*a* located at ends of the mask pattern portion 130 are each defined by the shielding portion 133 and the rib 125.

The shielding portions 133 that define the openings 131 and 131*a* of the mask pattern portion 130 have inclined portions 133*a* inclined at a constant inclination angle θ1 with respect to a side surface thereof. In addition, the ribs 125 that define the openings 131*a* located at ends of the mask pattern portion 130 include inclined portions 125*a* inclined at a constant inclination angle θ2 with respect to a side surface thereof.

The inclination angle θ1 of the inclined portion 133*a* formed at the side surface of the shielding portion 133 and the inclination angle θ2 of the inclined portion 125*a* formed at the side surface of the rib 125 may be in a range of about 0° to about 58°, for example, in a range of about 10° to about 53°. The inclination angles θ1 and θ2 may be greater than 58° as long as it is less than 90° depending on embodiments.

Figure 4:
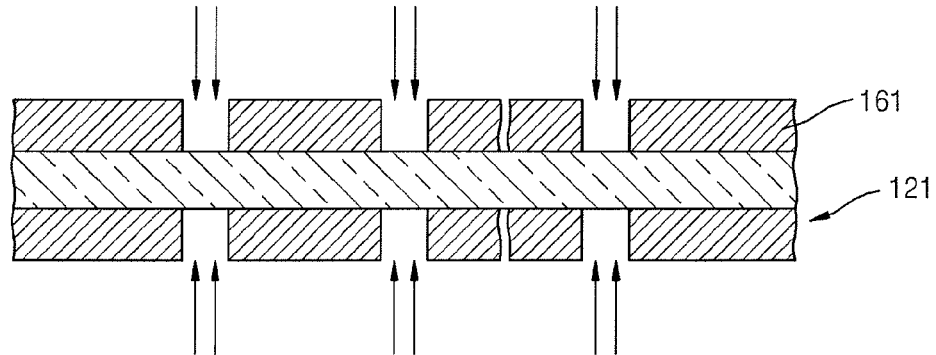
FIG. 4 is a cross-sectional view illustrating a method of forming a pattern on a substrate in a method of manufacturing a mask for depositing a thin film according to an embodiment.
Figure 5:
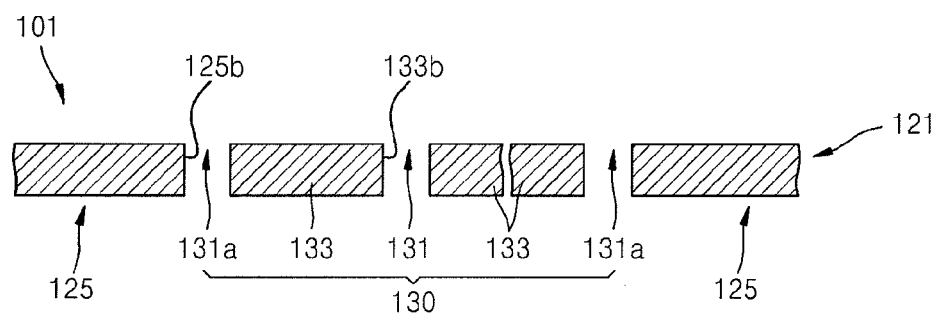
FIG. 5 is a cross-sectional view illustrating a state of a pattern that is formed on a substrate of FIG. 4.

FIG. 4 is a cross-sectional view illustrating a method of forming a pattern on a substrate in a method of manufacturing a mask for depositing a thin film according to an embodiment of the present invention. FIG. 5 is a cross-sectional view illustrating a state of a pattern that is formed on the substrate of FIG. 4.

The method of manufacturing a mask for depositing a thin film, according to an embodiment of the present invention, includes preparing a raw material substrate (or a mask substrate) 121 for a mask, in the form of a thin metal foil, removing a portion of the raw material substrate 121 to form a pattern 101 having a plurality of openings 131 and 131*a* on the raw material substrate 121, and performing a laser processing operation for forming inclined portions 133*a* and 125*a* at edges of the openings 131 and 131*a* of the pattern 101.

In one embodiment, the raw material substrate 121 for a mask is in the form of a thin metal foil. A method of forming a mask pattern portion 130 in the raw material substrate 121 may be performed by wet etching.

In one embodiment, as shown in FIG. 4, a photoresist film is coated on the raw material substrate 121 and patterned to form a photoresist film pattern 161, and the raw material substrate 121 is wet etched using the photoresist film pattern 161 to form the openings 131 and 131*a* that are defined by shielding portions 133 and ribs 125, thereby completing the formation of the mask pattern portion 130.

The forming of the mask pattern portion 130 in the raw material substrate 121 may be performed using other methods than by wet etching. For example, laser processing may be performed by irradiating a laser beam on the raw material substrate 121, thereby forming the mask pattern portion 130 therein.

However, when the mask pattern portion 130 is formed in the raw material substrate 121 by wet etching, side surfaces 133*b* of the shielding portion 133, which are at sides of the opening 131 and a side surface 125*b* of the rib 125, which is at a side of the opening 131*a*, have large cross-sections, and thus the wet etching process may not be suitable for use in a deposition process. In one embodiment, after the mask pattern portion 130 is formed in the raw material substrate 121, laser processing is performed to form inclined portions at edges of the openings 131 and 131*a*.

Figure 6:
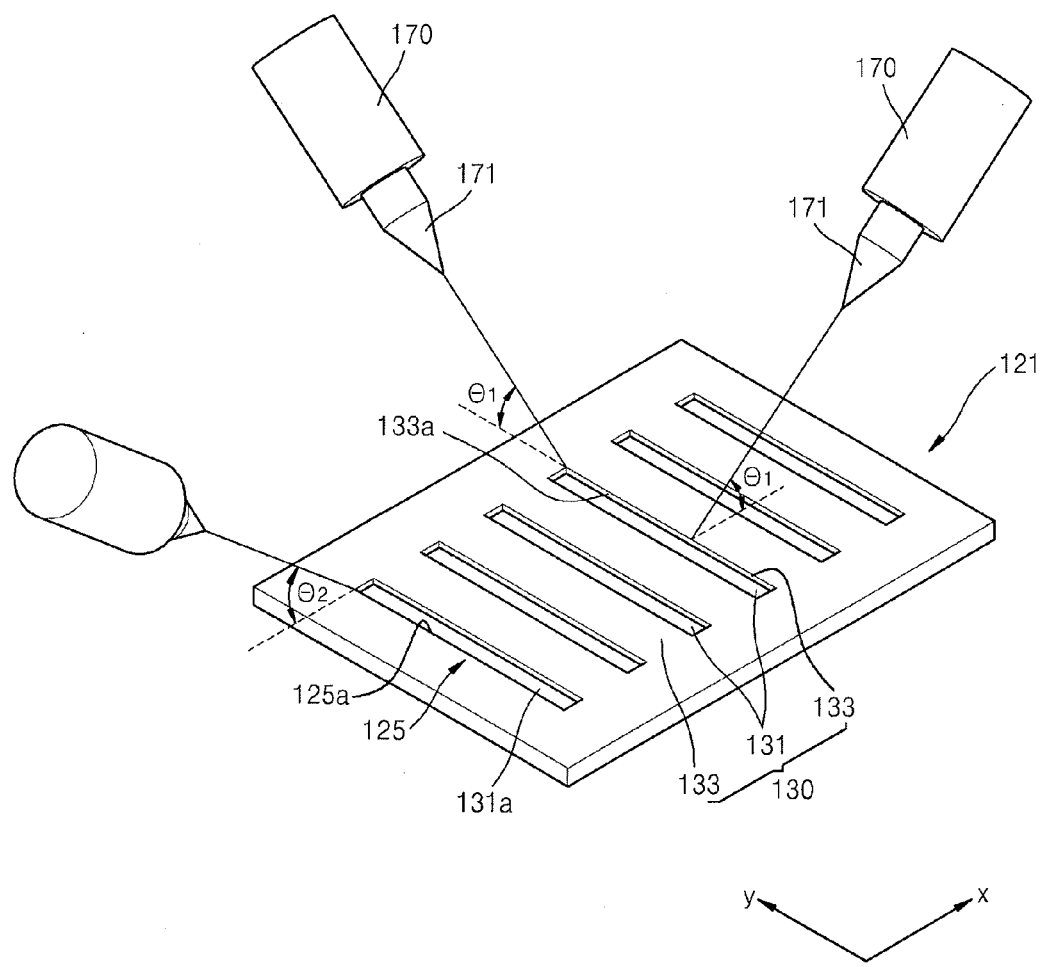
FIG. 6 is a perspective view illustrating a laser processing operation in which a laser beam is irradiated onto the substrate of FIG. 5, according to an embodiment.

FIG. 6 is a perspective view illustrating a laser processing operation in which a laser beam is irradiated onto the raw material substrate 121 of FIG. 5, according to an embodiment of the present invention.

In the laser processing operation, the inclined portions 133*a* and 125*a* are formed at the side surfaces of the openings 131 and 131*a* of the mask pattern portion 130. For example, a laser beam is irradiated onto the raw material substrate 121 at an inclination angle θ1 with respect to the raw material substrate 121 to form the inclined portions 133*a* and 125*a* at the side surfaces of the openings 131 and 131*a* of the mask pattern portion 130.

The laser beam is emitted from a laser head 170 disposed above the raw material substrate 121 and irradiated onto the edges of the openings 131 and 131*a*, thereby removing portions of the raw material substrate 121.

The laser head 170 includes a laser nozzle 171 that emits the laser beam. The laser nozzle 171 is set to form an inclination angle between the laser beam and the raw material substrate 121. The laser processing operation may be performed using a three-dimensional processing method in which the laser head 170 moves along the edges of the mask pattern portion 130 at a constant inclination angle θ1. For example, when the laser head 170 moves along a y-axis direction in which a long side of the opening 131 extends, the laser head 170 is tilted with respect to an x-axis direction, thereby maintaining an inclination angle θ1 with respect to the raw material substrate 121. In addition, when the laser head 170 moves along an x-axis direction in which a short side of the opening 131 extends, the laser head 170 is tilted with respect to a y-axis direction, thereby maintaining the constant inclination angle θ1 with respect to the raw material substrate 121. In another embodiment, a plurality of laser heads can be used to form inclined portions in different mask pattern portions or in different inclined portions of the same mask pattern portion.

As described above, the inclination angle formed between the raw material substrate 121 and the laser head 170 moving along the edges of the opening 131 is set to the inclination angle θ1, but is not limited thereto. For example, considering the effect of the mask pattern portion 130 on deposition performances, an inclination angle formed between the raw material substrate 121 and the laser head 170 when the laser head 170 moves along a y-axis direction in which a long side of the opening 131 extends may be different from an inclination angle formed between the raw material substrate 121 and the laser head 170 when the laser head 170 moves along an x-axis direction in which a short side of the opening 131 extends.

To form the inclined portion 125a at the side surface of the rib 125, which is at a side surface of the opening 131a that is defined by the rib 125, and the shielding portion 133, a laser beam irradiated onto the edge of the rib 125 may be adjusted to have an inclination angle θ2 with respect to the raw material substrate 121.

In the pattern 101 of the mask 120 manufactured using the method of manufacturing a mask for depositing a thin film, the shielding portion 133 and the rib 125 have sharp edges due to the inclined portions 133a and 125a, respectively, whereby a shadow effect does not occur.

In the method of manufacturing a mask for depositing a thin film, both the shielding portion 133 and the rib 125 of the mask pattern portion 130 may have sharp inclined portions with substantially the same inclination angle (θ1=θ2) at the edges thereof, but are not limited thereto.

Without the inclined portions, the shadow effect may most severely occur at the edges of the mask pattern portion 130. In one embodiment, to form a uniform thin film, the shielding portion 133 and the rib 125 that define the opening 131a of the mask pattern portion 130 have inclined portions 125a with an inclination angle θ2, and the shielding portions 133 disposed between the openings 131 has the inclined portion 133a with an inclination angle θ1 that is smaller than the inclination angle θ2.

The inclination angle θ1 of the inclined portion 133a formed at the side surface of the shielding portion 133 and the inclination angle θ2 of the inclined portion 125a formed at the side surface of the rib 125 may be in a range of about 0° to about 58°, for example, in a range of about 10° to about 53°.

Figure 7:
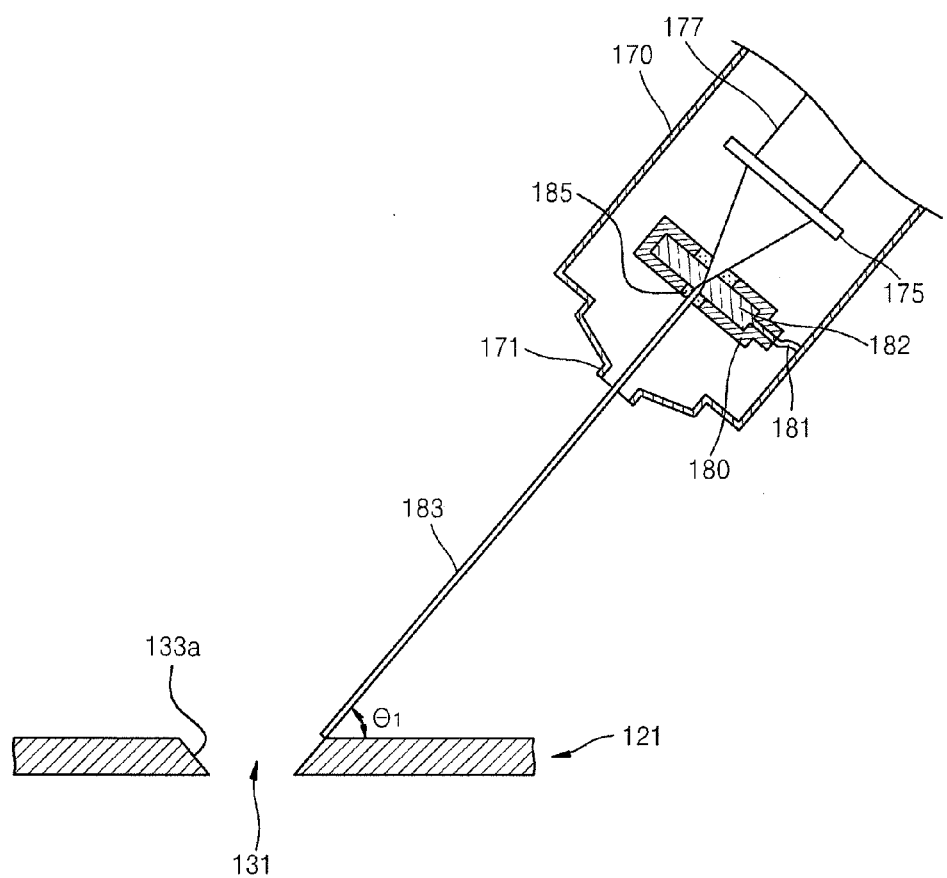
FIG. 7 is a partial cross-sectional view illustrating an internal structure of a laser head of FIG. 6, which irradiates a laser beam, according to an embodiment.

FIG. 7 is a partial cross-sectional view illustrating an internal structure of a laser head 170 of FIG. 6, which irradiates a laser beam 177, according to an embodiment of the present invention.

Referring to FIG. 7, the laser processing operation performed to form the inclined portions 133a at the edges of the opening 131 may be performed by laser water jet processing in which the laser beam 177 and a water jet 183 are emitted together.

The laser processing operation includes adjusting a direction of a water jet nozzle 185 with respect to the raw material substrate 121 to form an inclination angle θ1 between the water jet nozzle 185 and the raw material substrate 121, emitting the water jet 183 via the water jet nozzle 185, and transmitting the laser beam 177 to the water jet nozzle 185 to irradiate the laser beam 177 onto the raw material substrate 121.

The laser beam 177 is emitted from a laser beam source and proceeds towards the raw material substrate 121. In this regard, before the transmitting of the laser beam 177 to the water nozzle 185, the laser beam 177 may transmit through at least one lens 175.

In FIG. 7, the laser head 170 may simultaneously emit the laser beam 177 and the water jet 183. A tank 180 accommodating water 182 is posited inside of the laser head 170. The tank 180 may be provided with water from the outside of the laser head 170 via an inlet pipe 181.

The tank 180 includes the water jet nozzle 185 for ejecting water contained therein in the form of a water jet having a constant pressure. In one embodiment, the laser nozzle 171 and the water jet nozzle 185 of the laser head 170 are adjusted in such a way that a center point of the laser nozzle 171 is consistent with a center point of the water jet nozzle 185. As a result, the laser beam 177 and the water jet 183 may be accurately irradiated on a certain position of the raw material substrate 121.

In the embodiments described above, a method of manufacturing a mask for depositing a thin film for an organic electroluminescent device is described, but this method may be applied to the deposition of electrode patterns in various kinds of flat panel display devices such as liquid crystal display devices.

In the above embodiments, a linear-type pattern is described, but various types of patterns may be used. For example, a mask manufactured using the method of manufacturing a mask for depositing a thin film may have a circular-type pattern or an oval-type pattern.

As described above, according to the one or more of the above embodiments of the present invention, a pattern of a mask for depositing a thin film has inclined portions with sharp edges, and thus a shadow effect does not occur. In a method of manufacturing a mask for depositing a thin film, according to an embodiment of the present invention, the inclined portions are formed, by laser processing, at the edges of openings of a mask pattern portion, and thus a mask with excellent deposition performance may be manufactured at low manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a mask for depositing a thin film, the method comprising:
   providing a raw material substrate for a deposition mask;
   removing a portion of the raw material substrate to form a pattern, wherein a plurality of openings are defined in the pattern; and
   irradiating at least a laser beam onto the openings of the pattern at an inclination angle with respect to the raw material substrate such that inclined portions are formed at the side surfaces of each of the openings of the pattern,
   wherein the irradiating comprises emitting the laser beam and a water jet together, and wherein the irradiating comprises adjusting a direction of a water jet nozzle for ejecting the water jet to form the inclination angle between the water jet nozzle and the raw material substrate.

2. The method of claim 1, wherein the irradiating comprises moving the laser beam along edges of each of the openings of the pattern at the inclination angle so that at least part of the edges of the openings is removed to form the inclined portions.

3. The method of claim 1, wherein the irradiating further comprises:
ejecting the water jet via the water jet nozzle; and
irradiating the laser beam onto the raw material substrate through the water jet nozzle.

4. The method of claim 1, further comprising: before the laser beam, emitted from a laser beam source, reaches the water jet nozzle, transmitting the laser beam through at least one lens.

5. The method of claim 1, wherein the inclination angle is less than about 58°.

6. The method of claim 1, wherein the inclination angle is in a range of about 10° to about 53°.

7. The method of claim 1, wherein the pattern comprises:
a plurality of mask pattern portions respectively corresponding to unit devices arranged on a substrate on which a thin film is to be deposited; and
a plurality of ribs separating adjacent mask pattern portions, wherein each of the mask pattern portions comprises i) a plurality of openings having substantially the same pattern as that of a thin film constituting each of the unit devices arranged on the substrate on which the thin film is to be deposited and ii) a plurality of shielding portions defining the openings, wherein each of the shielding portions has inclined portions at side surfaces thereof.

8. The method of claim 7, wherein each of the ribs has an inclined portion at the side surface thereof, which is at a side of one of the openings.

9. The method of claim 1, wherein the pattern is formed by wet etching.

10. The method of claim 1, wherein the pattern is formed by irradiating a laser beam onto the raw material substrate to remove portions of the raw material substrate.

* * * * *